(12) United States Patent
Zeltser et al.

(10) Patent No.: US 8,576,518 B1
(45) Date of Patent: Nov. 5, 2013

(54) CURRENT-PERPENDICULAR-TO-THE-PLANE (CPP) MAGNETORESISTIVE (MR) SENSOR WITH EXCHANGE-COUPLED SIDE SHIELD STRUCTURE

(71) Applicant: HGST Netherlands B.V., Amsterdam (NL)

(72) Inventors: Alexander M. Zeltser, San Jose, CA (US); Stefan Maat, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/664,277

(22) Filed: Oct. 30, 2012

(51) Int. Cl.
*G11B 5/39* (2006.01)

(52) U.S. Cl.
USPC ............. 360/319; 360/324.1; 360/324.2

(58) Field of Classification Search
USPC .......... 360/319, 324.1, 324.11, 324.12, 324.2
See application file for complete search history.

(56) References Cited

U.S. PATENT DOCUMENTS

| | | | |
|---|---|---|---|
| 6,556,392 B1 | 4/2003 | Mao et al. | |
| 7,333,304 B2 | 2/2008 | Gill et al. | |
| 7,397,637 B2 | 7/2008 | Gill | |
| 7,495,867 B2 | 2/2009 | Sbiaa et al. | |
| 7,599,151 B2 * | 10/2009 | Hatatani et al. | 360/319 |
| 7,599,154 B2 | 10/2009 | Sbiaa et al. | |
| 8,125,746 B2 | 2/2012 | Dimitrov et al. | |
| 2005/0264948 A1 * | 12/2005 | Nakamoto et al. | 360/319 |
| 2011/0051291 A1 | 3/2011 | Miyauchi et al. | |
| 2011/0279923 A1 * | 11/2011 | Miyauchi et al. | 360/75 |
| 2012/0063035 A1 * | 3/2012 | Childress et al. | 360/319 |
| 2012/0087045 A1 * | 4/2012 | Yanagisawa et al. | 360/294 |
| 2012/0087046 A1 * | 4/2012 | Yanagisawa et al. | 360/294 |
| 2012/0154955 A1 | 6/2012 | Tsoukatos et al. | |
| 2012/0250189 A1 * | 10/2012 | Degawa et al. | 360/235.4 |
| 2012/0281319 A1 * | 11/2012 | Singleton et al. | 360/319 |

OTHER PUBLICATIONS

Haginoya et al., "Side-Shielded Tunneling Magnetoresistive Read Head for High-Density Recording", IEEE Transactions on Magnetics, Vol. 40, No. 4, Jul. 2004, pp. 2221-2223.
Hatatani et al., "Properties of Side-Shielded Read Heads in Longitudinal and Perpendicular Recording", IEEE Transactions on Magnetics, vol. 41, No. 11, Nov. 2005, pp. 4347-4350.
Zheng et al., "Side Shielded TMR Reader With Track-Width-Reduction Scheme", IEEE Transactions on Magnetics, vol. 42, No. 10, Oct. 2006, pp. 2303-2305.

* cited by examiner

*Primary Examiner* — Jefferson Evans
(74) *Attorney, Agent, or Firm* — Thomas R. Berthold

(57) ABSTRACT

A current-perpendicular-to-the-plane magnetoresistive sensor has an exchange-coupled side shield structure on each of two side regions of the sensor and an exchange-coupled top shield structure on the sensor and the two exchange-coupled side shield structures. Each exchange-coupled structure comprises an antiferromagnetic layer and a shield of soft magnetically permeable material exchange-coupled with the antiferromagnetic layer. Each side shield and the top shield has its magnetization oriented generally parallel to the sensor front edge and generally parallel to the plane of the sensor's free ferromagnetic layer. The shields in each exchange-coupled side shield structure and the exchange-coupled top shield structure may be an antiparallel coupled structure of two magnetically permeable films separated by a nonmagnetic coupling film.

19 Claims, 8 Drawing Sheets

CURRENT-PERPENDICULAR-TO-THE-PLANE (CPP) MAGNETORESISTIVE (MR) SENSOR WITH EXCHANGE-COUPLED SIDE SHIELD STRUCTURE

BACKGROUND OF THE INVENTION

1. Field of the Invention

The invention relates generally to a current-perpendicular-to-the-plane (CPP) magnetoresistive (MR) sensor that operates with the sense current directed perpendicularly to the planes of the layers making up the sensor stack, and more particularly to a CPP-MR sensor with side shields.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field is detectable as a change in electrical resistance. If the sense current is directed perpendicularly through the planes of the layers in the sensor stack, the sensor is referred to as a current-perpendicular-to-the-plane (CPP) sensor.

In addition to CPP-GMR read heads, another type of CPP-MR sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu. In a CPP-TMR read head the nonmagnetic spacer layer is formed of an electrically insulating material, such as $TiO_2$, MgO, or $Al_2O_3$.

The sensor stack in a CPP-MR read head is located between two along-the-track shields of soft magnetically permeable material that shield the read head from recorded data bits in the track that are neighboring the data bit being read. The sensor stack has an edge that faces the disk with a width referred to as the track width (TW). The sensor stack has a back edge recessed from the edge that faces the disk, with the dimension from the disk-facing edge to the back edge referred to as the stripe height (SH). The sensor stack is generally surrounded at the TW edges and back edge by insulating material. A layer of hard magnetic material is used to bias or stabilize the magnetization of the free layer and is deposited on both sides of the sensor onto insulating material on each side of the TW edges. As the data density increases in magnetic recording disk drives, there is a requirement for a decrease in the read head dimensions, more particularly the TW. However, the effective or "magnetic" TW does not decrease linearly with a decrease in the physical TW because of side reading of data bits from adjacent tracks. To overcome this problem, side shields of soft magnetically permeable material located on the sides of the sensor have been proposed to absorb magnetic flux from data bits in adjacent tracks. The side shields require that the soft magnetic material be located on the sides of the free layer at the TW edges, which means that the hard magnetic biasing material must be removed. This requires the use of an alternative technique to maintain magnetic stabilization of the free layer.

What is needed is a CPP-MR sensor with a side shield structure that also maintains magnetic stabilization of the free layer.

SUMMARY OF THE INVENTION

The invention relates to a CPP-MR sensor, like a CPP-GMR or CPP-TMR read head, with an exchange-coupled side shield structure on each of two side regions of the sensor and an exchange-coupled top shield structure on the sensor and the two exchange-coupled side shield structures. Each exchange-coupled structure comprises an antiferromagnetic layer and a shield of soft magnetically permeable material exchange-coupled with the antiferromagnetic layer. Each side shield and the top shield has its magnetization oriented generally parallel to the sensor front edge and generally parallel to the plane of the sensor's free ferromagnetic layer. Thus the exchange-coupled side shield structures provide a side shielding function as well as longitudinal biasing of the sensor's free ferromagnetic layer to stabilize the magnetization of the free layer. The shields in each exchange-coupled side shield structure and the exchange-coupled top shield structure may be an antiparallel coupled structure of two magnetically permeable films separated by a nonmagnetic coupling film. The material for the shields may be selected from $NiFe_x$, $(NiFe_x)Mo_y$, and $(NiFe_x)Cr_y$, where the subscripts are in atomic percent, where x is greater than or equal to 1 and less than or equal to 25 and where y is greater than or equal to 1 and less than or equal to 8. The NiFe alloy has a saturation magnetization greater than or equal to 450 emu/$cm^3$ and less than or equal to 900 emu/$cm^3$ and an easy-axis coercivity less than 10 Oe.

For a fuller understanding of the nature and advantages of the present invention, reference should be made to the following detailed description taken together with the accompanying figures.

DETAILED DESCRIPTION OF THE INVENTION

Figure 1:
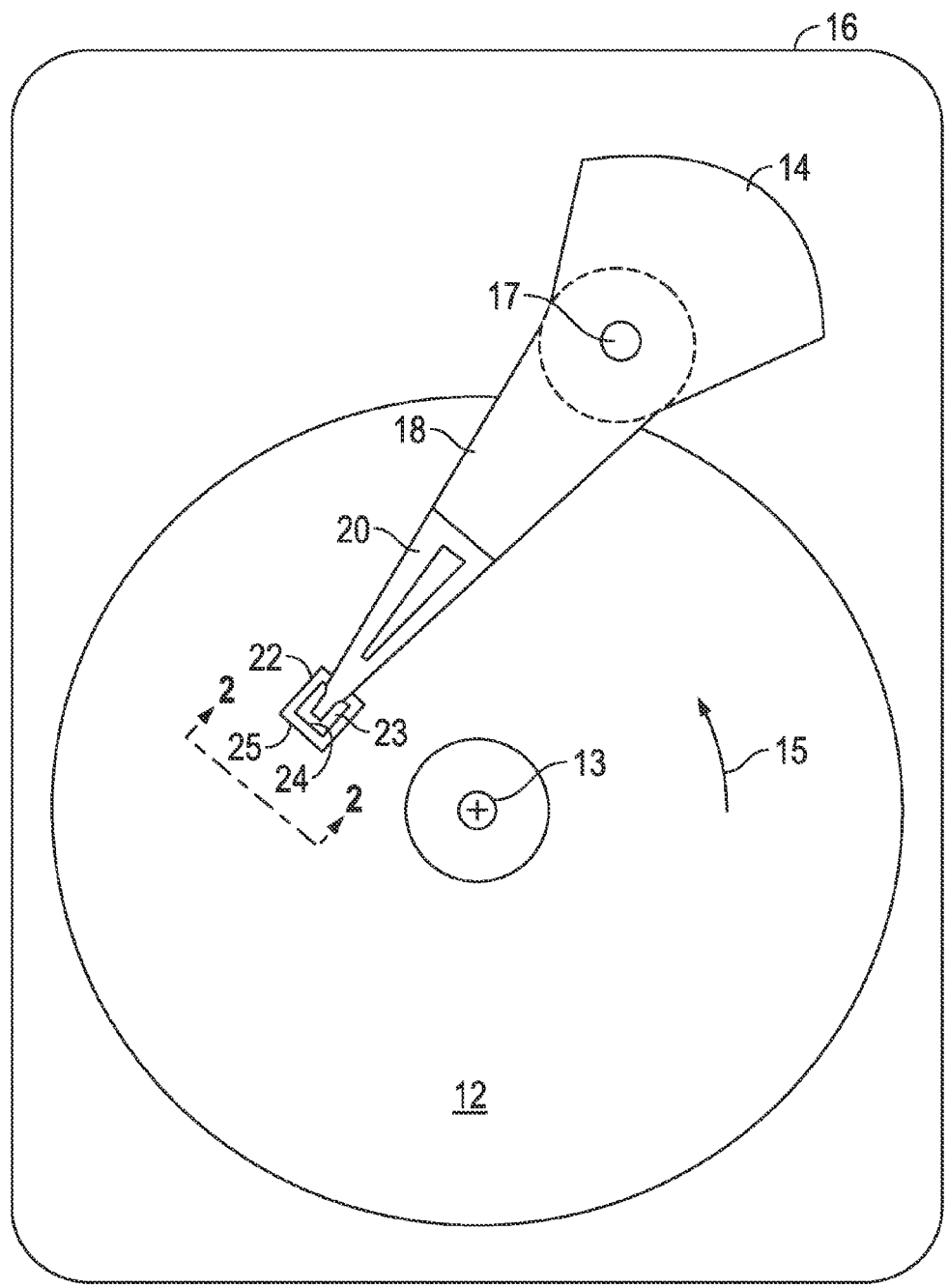
FIG. 1 is a schematic top view of a conventional magnetic recording hard disk drive with the cover removed.

The CPP magnetoresistive (MR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
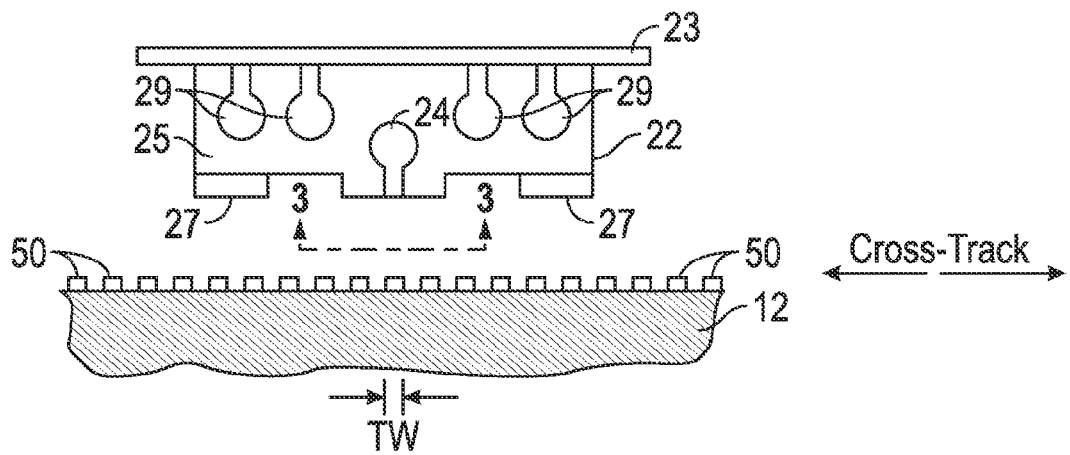
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric magnetic data tracks with track width TW are created when the write head writes on the continuous recording layer.

Figure 3:
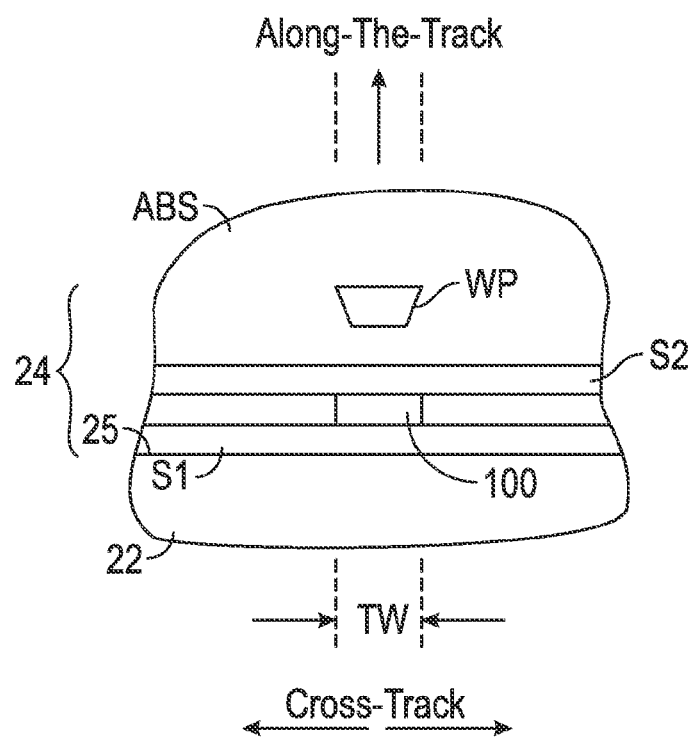
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP-MR sensor or read head 100 is located between two magnetic shields S1 and S2. The shields S1, S2 are formed of soft magnetically permeable material, typically a NiFe alloy, and may also be electrically conductive so they can function as the electrical leads to the read head 100. The shields function to shield the read head 100 from recorded data bits in the along-the-track direction that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
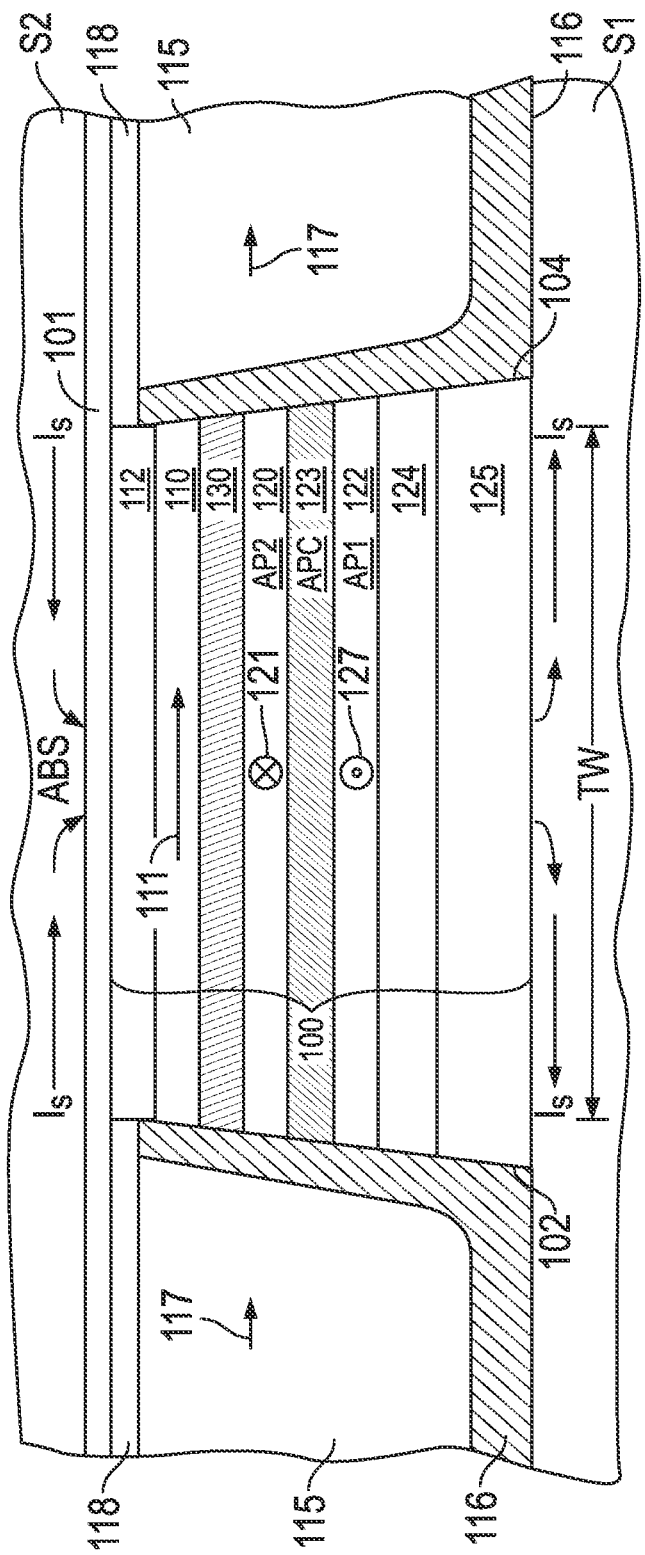
FIG. 4 is a cross-sectional schematic view of a conventional CPP-MR read head showing the stack of layers located between the along-the-track magnetic shield layers.

FIG. 4 is view of the ABS showing the layers making up a conventional CPP-MR sensor structure as would be viewed from the disk. Sensor 100 is a CPP-MR read head comprising a stack of layers formed between the two magnetic shield layers S1, S2. The sensor 100 has a front edge at the ABS and spaced-apart side edges 102, 104. The shields S1, S2 are formed of an electrically conductive magnetic material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2. The Ru layer is used to adjust the magnetic read gap and the NiFe layer functions as the plating seed for S2, which typically also is a NiFe alloy such as permalloy.

The sensor 100 layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110. The width of the free layer 110 essentially defines the sensor's physical track width (TW). The CPP-MR sensor 100 may be a CPP GMR sensor, in which case the nonmagnetic spacer layer 130 would be formed of an electrically conducting material, typically a metal like Cu, Au or Ag. Alternatively, the CPP-MR sensor 100 may be a CPP tunneling MR (CPP-TMR) sensor, in which case the nonmagnetic spacer layer 130 would be a tunnel barrier formed of an electrically insulating material, like $TiO_2$, MgO, or $Al_2O_3$.

The pinned ferromagnetic layer in a CPP-MR sensor may be a single pinned layer or an antiparallel (AP) pinned structure like that shown in FIG. 4. The pinned layer in the CPP GMR sensor in FIG. 4 is a well-known AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The AP1 and AP2 layers, as well as the free ferromagnetic layer 110, are typically formed of crystalline CoFeB, CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. The AF layer 124 is typically a Mn alloy, e.g., PtMn, NiMn, FeMn, IrMn, PdMn, PtPdMn or RhMn. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net magnetization of the AP-pinned structure, remains high.

A seed layer 125 may be located between the lower shield layer S1 and the AP-pinned structure to enhance the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, Ir, or a Ru/Ta/Ru, Ru/Ti/Ru, or Cu/Ru/Ta trilayer.

In the presence of an external magnetic field in the range of interest, i.e., magnetic fields from recorded data on the disk, the magnetization direction 111 of free layer 110 will rotate while the magnetization direction 121 of reference layer 120 will remain fixed and not rotate. Thus when a sense current $I_S$ is applied from top shield S2 perpendicularly through the sensor stack to bottom shield S1 (or from S1 to S2), the magnetic fields from the recorded data on the disk will cause rotation of the free-layer magnetization 111 relative to the reference-layer magnetization 121, which is detectable as a change in electrical resistance.

A ferromagnetic biasing layer 115, such as a CoPt or CoCrPt hard magnetic bias layer, is also typically formed outside of the sensor stack near the side edges 102, 104 of the sensor 100. The biasing layer 115 is electrically insulated from side edges 102, 104 of sensor 100 by insulating layer 116. A capping layer 118, such as layer of Cr, or a multilayer of Ta/Cr is deposited on top of the biasing layer 115. The upper layer of capping layer 118, for example Cr, also serves the purpose as a chemical-mechanical-polishing (CMP) stop layer during fabrication of the sensor. The biasing layer 115 has a magnetization 117 generally parallel to the ABS and thus longitudinally biases the magnetization 111 of the free layer 110. Thus in the absence of an external magnetic field its magnetization 117 is parallel to the magnetization 111 of the free layer 110.

Figure 5:
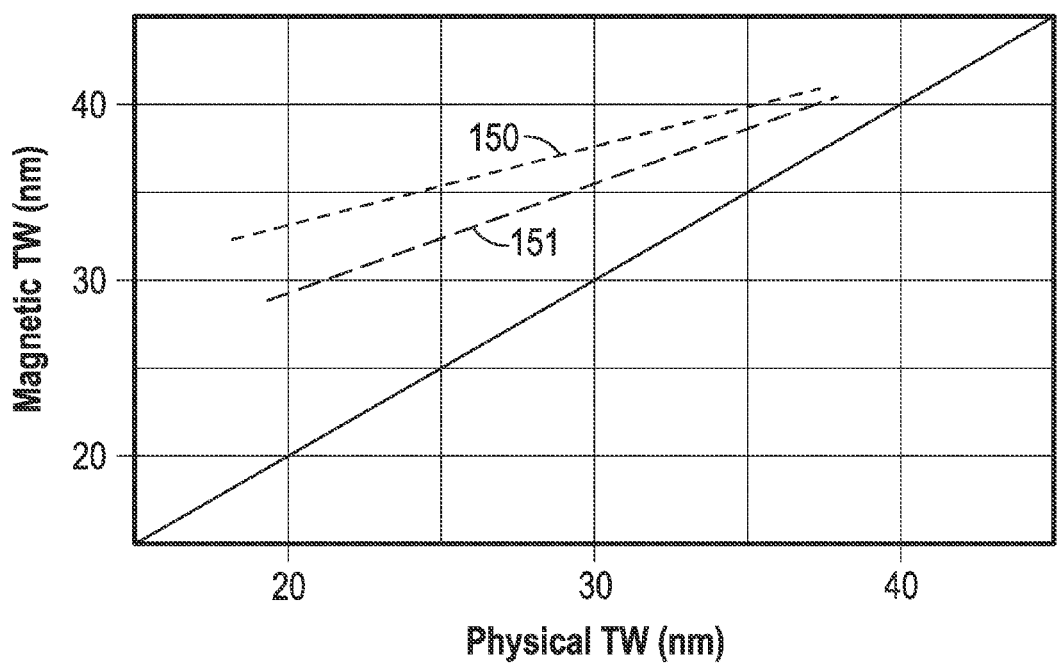
FIG. 5 is a graph of modeling data of magnetic track width (TW) versus physical TW for a conventional CPP-MR read head with hard bias stabilization and a CPP-MR head with side shield stabilization according to the invention.

As the data density increases in magnetic recording disk drives, there is a requirement for a decrease in the read head dimensions, more particularly the TW. However, the effective or "magnetic" TW is generally wider than the physical TW. The magnetic TW decreases at a lower rate than the physical TW because of side reading of data bits from adjacent tracks and the head-to-media spacing. This is shown by line 150 in FIG. 5 which is modeling data for a sensor with hard bias stabilization. For example, a magnetic TW of about 40 nm can be achieved with a physical TW of about 35 nm. However, to reduce the magnetic TW by 5 nm, to about 35 nm, the physical track width must be reduced by 10 nm, to about 25 nm. This effect is due to the sensor being more sensitive to magnetic fields from data bits in adjacent tracks as the physical TW is made smaller. Sensors with side shields of soft magnetically permeable material have been proposed to address this problem, but this requires removal of the hard magnetic biasing layer (layer 115 in FIG. 4) and thus the use of alternative techniques to magnetically stabilize the free layer, such as "in-stack" biasing. Haginoya et al., "Side-Shielded Tunneling Magnetoresistive Read Head for High-Density Recording", *IEEE Transactions on Magnetics*, Vol. 40, No. 40, July 2004, pp. 2221-2223 and US2011/0051291 A1 disclose sensors with side shields and in-stack flux-closure biasing structures.

Figure 6:
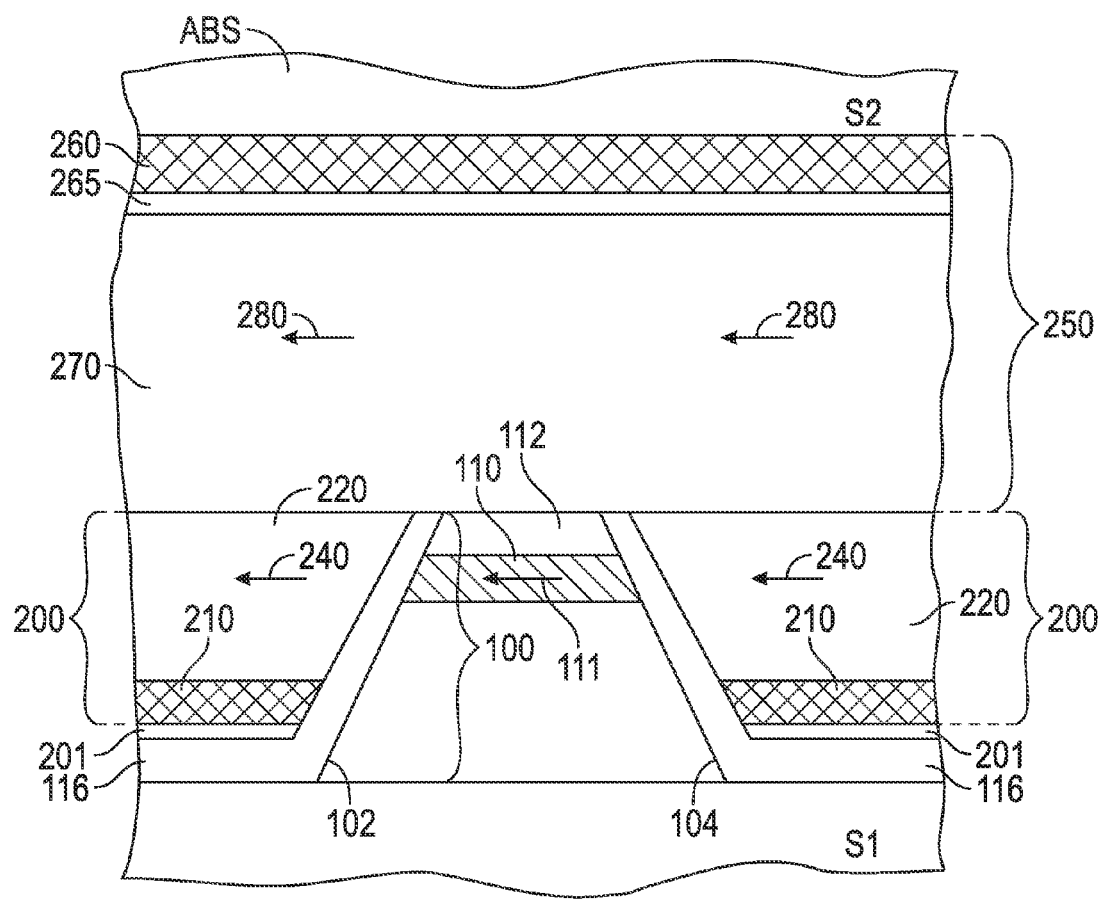
FIG. 6 is a cross-sectional schematic view of the CPP-MR read head according to the invention showing the exchange-coupled side shield structure.

In the CPP-MR sensor of this invention, as shown in the ABS view of FIG. 6, an exchange-coupled structure 200 on each side of the sensor 100 provides a side shielding function as well as longitudinal biasing of the free layer 110 to stabilize the magnetization 111 of the free layer. The sensor 100 may be the prior art stack of layers as shown in FIG. 4 with side edges 102, 104 and insulating layer 116 on the side edges. The sensor 100 is located on a central region of a substrate, in this example an along-the-track shield S1, with exchange-coupled structures 200 on side regions of S1.

Each exchange-coupled structure 200 comprises a first antiferromagnetic (AF) layer 210 and a layer 220 of soft magnetically permeable material. "Soft" magnetic material can be easily magnetized and demagnetized at low magnetic fields. Layer 220 is preferably an alloy comprising Ni and Fe with permeability ($\mu$) preferably greater than 100. Layer 220 should also have a low easy-axis coercivity, less than 10 Oe, and a saturation magnetization $M_s$ greater than or equal to 450 emu/cm$^3$ and less than or equal to 900 emu/cm$^3$. Any of the known materials suitable for use in the along-the-track shields S1 and S2 may be used for layer 220. Specific compositions include NiFe$_x$, where x is between 1 and 25, and (NiFe$_x$)Mo$_y$ or (NiFe$_x$)Cr$_y$, where y is between 1 and 8, where the subscripts are in atomic percent. An optional a 1-2 nm thick Co or CoFe alloy coupling layer may be inserted between AF layer 210 and permeable side-shield layer 220 to increase the exchange coupling. Layer 220 should have a thickness so that it extends at least to above the top of free layer 110. The typical thickness of the stack of layers making up sensor 100 is between about 20 and 35 nm. The AF layer 210 is preferably IrMn (where Mn is between 70 and 85 atomic percent), or any other known AF material, like PtMn, NiMn, FeMn, PdMn, PtPdMn or RhMn. The AF layer 210 is exchange coupled with layer 220 and thus biases the magnetization 240 of layer 220 to stabilize the magnetization 111 of free layer 110. An optional seed layer 201, comprising one or more layers of NiFeCr, NiFe, Ta, Cu or Ru may be located on shield S1 to facilitate the growth of AF layer 210. AF layer 210 has a thickness in the range of 4 to 10 nm and soft magnetic layer 220 has a typical thickness in the range of 10 to 25 nm. The total stack of insulator 116, seed layer 201, AF layer 210, and soft magnetic layer 220 is about the same height as the sensor 100. Generally the side shield structure is deposited after the sensor 100 junction is formed by photo-lithographical patterning and subsequent ion-milling. The structure is then planarized by chemical mechanical polishing (CMP). Due to various CMP rates of the top side-shield layer 220 (for example NiFe) and sensor capping layer 112 material (for example Ru) some topographical variations from processing are possible, so the side shield may be somewhat thicker or thinner than the sensor 100.

An exchange-coupled top shield structure 250 is located on the sensor 100 and the two side shield exchange-coupled structures 200. The exchange-coupled top shield structure 250 functions as an along-the-track shield, so conventional plated shield S2 is not required, but may optionally be retained on top of structure 250, for example to facilitate the conventional ABS processing. The exchange-coupled top shield structure 250 comprises a layer 270 of soft magnetically permeable material exchange coupled to AF layer 260. Layer 270 may be formed of the same material as layer 220 and AF layer 260 may be IrMn, or other suitable AF material, like that used for AF layer 210. The AF layer 260 is exchange coupled with layer 270 and thus biases the magnetization 280 of layer 270 to assist in stabilizing the magnetization 111 of free layer 110. An optional coupling layer 265, for example a 1-2 nm Co or CoFe alloy may be deposited on layer 270 to improve exchange coupling of layer 270 by AF layer 260. The layer 270 is preferably in contact with layer 220. Thus first soft magnetic layer 220 and second soft magnetic layer 270 can be considered as a single soft magnetic layer that is exchange-coupled at the bottom and top by AF layers 210, 260, respectively. The exchange-coupled structures 220 and 270 thus provide both side shield and top along-the track shield functions while also stabilizing the magnetization 111 of free layer 110.

Both modeling and experimental data showed that the sensor with side shields has smaller magnetic track width for the same physical track width. This is shown by line 151 in FIG. 5, where for a given physical TW a smaller magnetic TW is achieved for a sensor with side shield stabilization as compared to a sensor with hard bias stabilization (line 150). In particular, the magnetic track width is 2-3 nm smaller for the sensor with side shields compared to a sensor with conventional hard bias stabilization for sensors with a physical track width between 20 and 35 nm.

Figure 7:
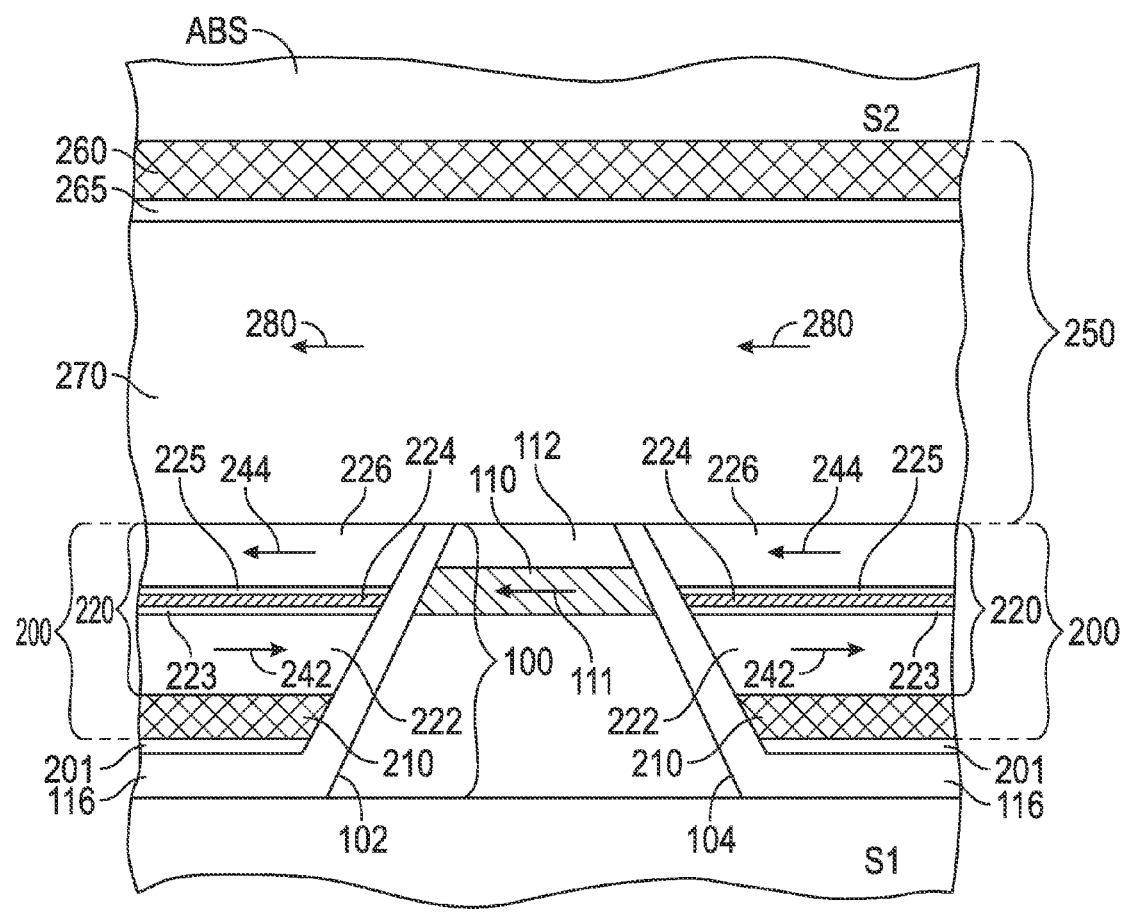
FIG. 7 is a cross-sectional schematic view of the CPP-MR read head according to the invention showing the soft magnetic layers of the exchange-coupled side shield structure as antiparallel (AP) coupled structures.

The first soft magnetic layer 220 in each exchange-coupled structure 200 may be a well-known antiparallel (AP) coupled structure as shown in FIG. 7. Soft magnetic layers 222, 226 are separated by a nonmagnetic antiparallel coupling (APC) layer 224, typically a 0.5-1 nm thick layer of Ru or Cr. To improve coupling, 1-2 nm thick layers 223 and 225 of Co, Fe, or a CoFe alloy may be located between the APC layer 224 and soft magnetic layers 222, 226, respectively. In that case if Ru is chosen as the APC layer 224, layers 223 and 225 may be Co or a Co-rich CoFe alloy, and if Cr is chosen as the APC layer 224, layers 223 and 225 may be Fe or a Fe-rich FeCo alloy. In either case the thickness of the APC layer 224 is chosen to provide adequate coupling and will depend on the material of layers 223 and 225. The lower layer 222 is exchange-coupled to AF layer 210 and has a magnetization 242. The upper layer 226 is AP coupled across nonmagnetic layer 224 and has an antiparallel magnetization 244. In the example of FIG. 7, lower layer 224 has a lower moment than upper layer 226, so that the net magnetic moment of the AP coupled structure biases the magnetization 111 of free layer 110.

Figure 8:
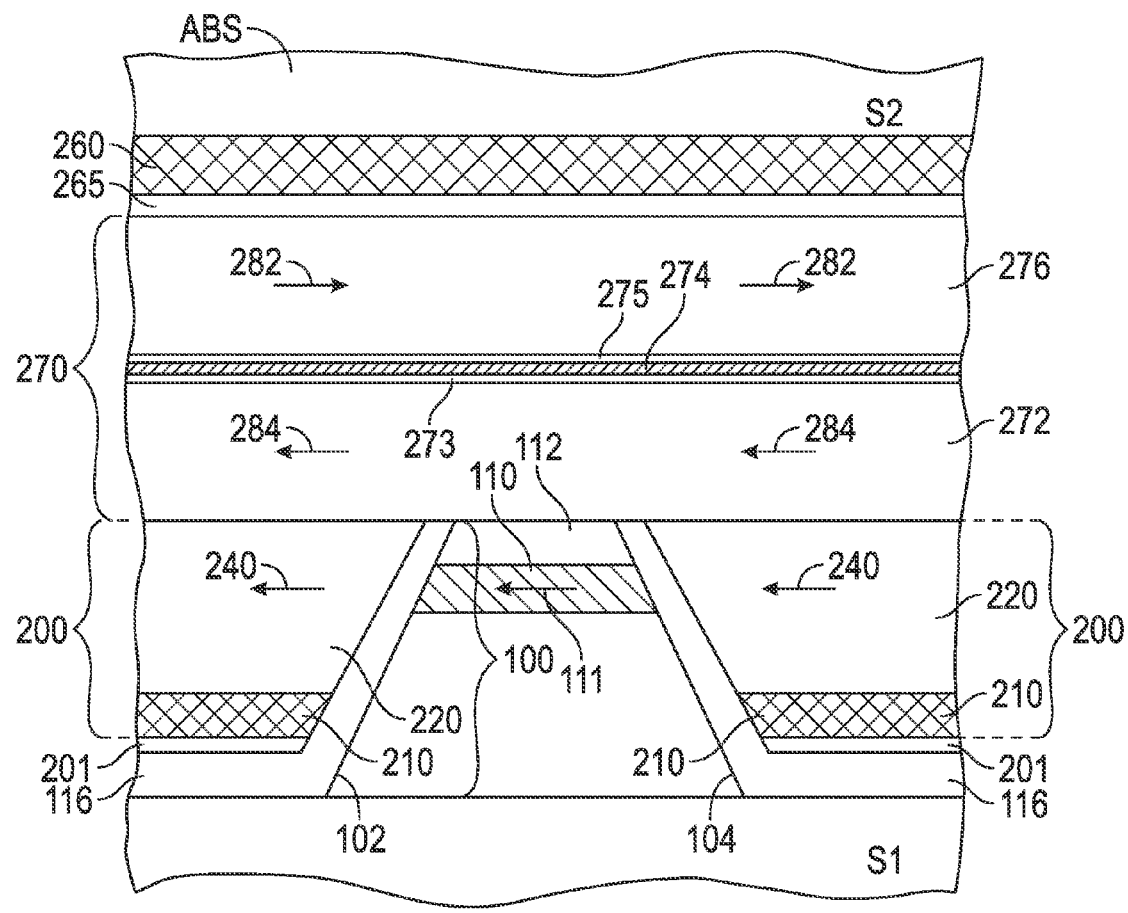
FIG. 8 is a cross-sectional schematic view of the CPP-MR read head according to the invention showing the soft magnetic layer of the exchange-coupled top shield structure as an antiparallel (AP) coupled structure.

The soft magnetic layer 270 in top shield structure 250 may also be a well-known antiparallel (AP) coupled structure, as described above for the side shield structure in FIG. 7. This is shown in FIG. 8 with soft magnetic layers 272, 276 are separated by a nonmagnetic antiparallel coupling (APC) layer 274, with optional layers 273, 275 of Co, Fe, or CoFe depending on the choice of APC material as described above. The upper layer 276 is exchange-coupled to AF layer 260 and has a magnetization 282. The lower layer 272 is AP coupled across nonmagnetic layer 274 and has an antiparallel magnetization 284.

Figure 9:
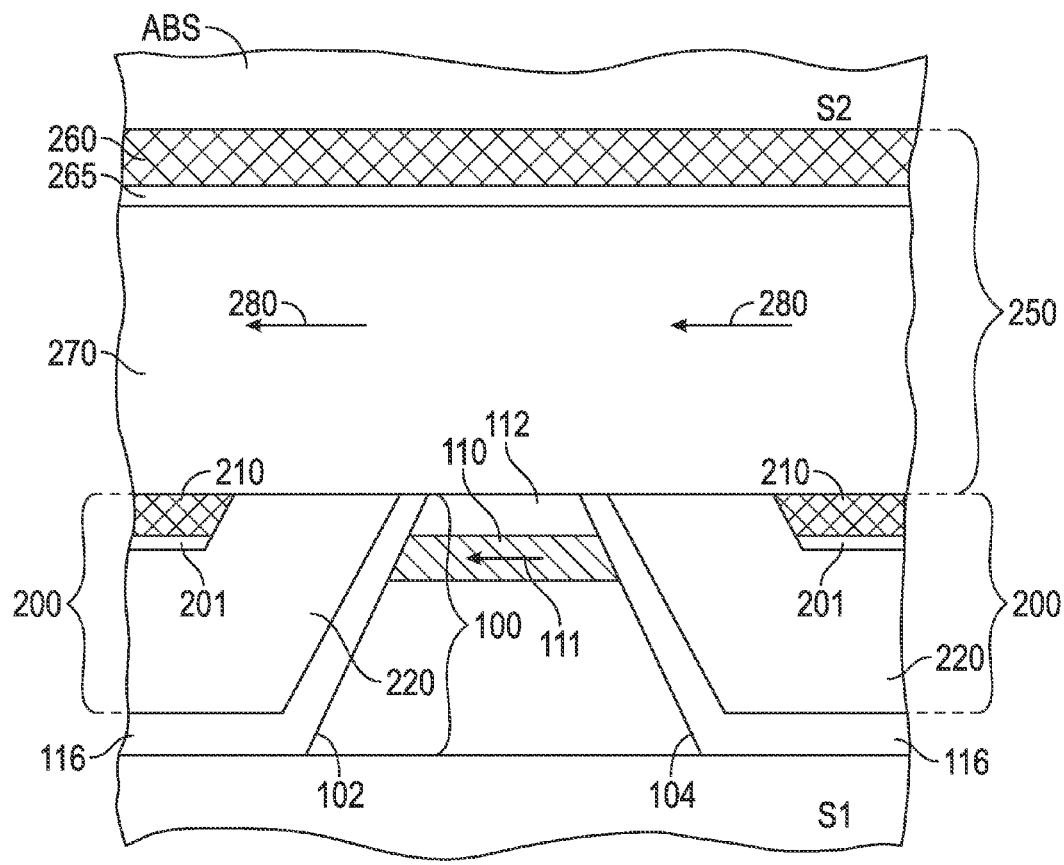
FIG. 9 is a cross-sectional schematic view of the CPP-MR read head according to the invention showing the antiferromagnetic (AF) layers located above the soft magnetic layers in the exchange-coupled side shield structure.

The AF layer 210 may also be located on top of soft magnetic layer 220 and spaced from the side edges 102, 104 of the sensor 100, as shown in FIG. 9. In this example the lateral separation of the AF layer 210 from the side edges 102, 104 is preferably approximately one track width, but could also be wider. Some separation is required since the sufficiently soft side shield material needs to be adjacent to the side edges 102 and 104 to stabilize the magnetization 111 of free layer 110. Some separation will occur naturally if the soft magnetic layer 220, which is deposited prior to AF layer 210, is deposited with some side coverage, for example by ion-beam deposition at a shallow angle.

The CPP-MR read head according to the invention, as shown in FIG. 6, can be fabricated using well-known techniques like those used to fabricate conventional CPP-MR read heads. First, all of the layers making up the sensor 100 stack are deposited as full films on S1. A thin silicon (Si) film is then deposited as a full film on capping layer 112. The Si is an adhesion film for a subsequently deposited full film of hard mask material, like diamond-like carbon (DLC). A layer of photoresist is then deposited on the DLC. The photoresist is then lithographically patterned to define the two side edges 102, 104 of the sensor 100. An ion milling step removes the layers outside the sensor side edges down to S1. The side regions are then refilled by deposition of the insulating layer 116, typically alumina or silicon nitride ($SiN_x$), optional seed layer 201, the AF layer 210 and the soft magnetic layer 220. A second Si adhesion layer and second DLC layer are then deposited in the side regions over the two exchange-coupled structures 220. The photoresist and deposited material on top of the photoresist are then removed by chemical-mechanical-polishing (CMP) assisted lift-off down to the DLC layers. A reactive ion etching (RIE) step then removes the DLC. An ion milling step is then performed to remove the Si layers. This is followed by disposition of the layers making up top shield structure 250. To set the magnetization directions of the exchange-coupled soft side-shields and top-shield an annealing step with a magnetic field in a direction substantially parallel to the ABS is required. Since the pinned layer structure in the sensor 100 (see APC, AP1 and AP2 layers in FIG. 4) has a magnetization direction substantially perpendicular to the ABS this annealing step must be done so it will not disturb the pinned layer magnetization direction. This is achieved by annealing at a temperature T2 lower than the temperature T1 that is used to set the direction of the magnetization of the pinned layer structure in the sensor 100. For example, if T1 is in the range of 250 to 300° C., T2 is in the range of 150 to 200° C.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor structure for sensing magnetically recorded data from a magnetic recording medium, the structure comprising:
   a substrate;
   a magnetoresistive sensor comprising a stack of layers including a ferromagnetic free layer on a central region of the substrate and having a front edge for facing a magnetic recording medium, a back edge recessed from the front edge, and two spaced-apart side edges, the sensor being capable of sensing magnetically recorded data when a sense current is applied perpendicular to the planes of the layers in the sensor stack;
   an exchange-coupled side shield structure on each of two side regions of the substrate adjacent said central region of the substrate, each exchange-coupled structure comprising a side shield of magnetically permeable material and a first antiferromagnetic layer exchange-coupled with said side shield, said side shield having its magnetization oriented generally parallel to said sensor front edge and generally parallel to the plane of said free layer;
   an electrically insulating layer between each exchange-coupled structure and a sensor side edge;
   a top shield of magnetically permeable material on the sensor and the two exchange-coupled side shield structures; and
   a second antiferromagnetic layer on the top shield, said top shield having its magnetization oriented generally parallel to the magnetization of each side shield.

2. The sensor structure of claim 1 wherein, in each exchange-coupled side shield structure, the first antiferromagnetic layer is located between the substrate and the side shield.

3. The sensor structure of claim 1 wherein, in each exchange-coupled side shield structure, a portion of the side shield is located between the first antiferromagnetic layer and the sensor side edge.

4. The sensor structure of claim 1 further comprising, in each exchange-coupled side shield structure, a coupling layer selected from Co and a CoFe alloy between the first antiferromagnetic layer and the side shield.

5. The sensor structure of claim 1 wherein, in each exchange-coupled side shield structure, the side shield comprises an antiparallel coupled structure of two magnetically permeable films separated by a nonmagnetic coupling film.

6. The sensor structure of claim 1 wherein the magnetically permeable material of the top shield is in contact with the magnetically permeable material of each side shield structure.

7. The sensor structure of claim 1 wherein each side shield is an alloy comprising Ni and Fe and having a saturation magnetization greater than or equal to 450 emu/cm$^3$ and less than or equal to 900 emu/cm$^3$ and an easy-axis coercivity less than 10 Oe.

8. The sensor structure of claim 1 wherein each side shield is selected from NiFe$_x$, (NiFe$_x$)Mo$_y$, and (NiFe$_x$)Cr$_y$, where the subscripts are in atomic percent, where x is greater than or equal to 1 and less than or equal to 25 and where y is greater than or equal to 1 and less than or equal to 8.

9. The sensor structure of claim 1 wherein the first antiferromagnetic layer is an alloy consisting essentially of Or and Mn.

10. The sensor structure of claim 1 wherein the magnetoresistive sensor is a giant magnetoresistance (GMR) sensor.

11. The sensor structure of claim 10 wherein the top shield comprises an antiparallel coupled structure of two magnetically permeable films separated by a nonmagnetic coupling film.

12. The sensor structure of claim 1 wherein the magnetoresistive sensor is a tunneling magnetoresistance (TMR) sensor.

13. A magnetoresistive sensor structure for sensing magnetically recorded data from a magnetic recording medium, the structure comprising:
 a substrate;
 a current-perpendicular-to-the-plane magnetoresistive (CPP-MR) sensor comprising a stack of layers including a ferromagnetic free layer on a central region of the substrate and having a front edge for facing a magnetic recording medium, a back edge recessed from the front edge, and two spaced-apart side edges;
 an exchange-coupled side shield structure on each of two side regions of the substrate adjacent said central region of the substrate, each exchange-coupled side shield structure comprising a first antiferromagnetic layer on the substrate and a side shield of magnetically permeable material on and exchange-coupled with said first antiferromagnetic layer, said side shield having its magnetization oriented generally parallel to said sensor front edge and generally parallel to the plane of said free layer and being formed of a material selected from NiFe$_x$, (NiFe$_x$)Mo$_y$, and (NiFe$_x$)Cr$_y$, where the subscripts are in atomic percent, where x is greater than or equal to 1 and less than or equal to 25 and where y is greater than or equal to 1 and less than or equal to 8;
 an electrically insulating layer between each exchange-coupled side-shield structure and a sensor side edge;
 an exchange-coupled top shield structure comprising a top shield of magnetically permeable material on the sensor and the two exchange-coupled side shield structures and a second antiferromagnetic layer on the top shield, said top shield having its magnetization oriented generally parallel to the magnetization of each side shield.

14. The sensor structure of claim 13 wherein the top shield is formed of the same material as each said side shield.

15. The sensor structure of claim 13 further comprising, in each exchange-coupled side shield structure, a coupling layer selected from Co and a CoFe alloy between the first antiferromagnetic layer and the side shield.

16. The sensor structure of claim 13 wherein, in each exchange-coupled side shield structure, the side shield comprises an antiparallel coupled structure of two magnetically permeable films separated by a nonmagnetic coupling film.

17. The sensor structure of claim 13 wherein the magnetically permeable material of the top shield is in contact with the magnetically permeable material of each side shield structure.

18. The sensor structure of claim 13 wherein each side shield has a saturation magnetization greater than or equal to 450 emu/cm$^3$ and less than or equal to 900 emu/cm$^3$ and an easy-axis coercivity less than 10 Oe.

19. The sensor structure of claim 13 wherein the top shield comprises an antiparallel coupled structure of two magnetically permeable films separated by a nonmagnetic coupling film.

* * * * *

UNITED STATES PATENT AND TRADEMARK OFFICE
CERTIFICATE OF CORRECTION

| | | |
|---|---|---|
| PATENT NO. | : 8,576,518 B1 | Page 1 of 1 |
| APPLICATION NO. | : 13/664277 | |
| DATED | : November 5, 2013 | |
| INVENTOR(S) | : Alexander M. Zeltser et al. | |

It is certified that error appears in the above-identified patent and that said Letters Patent is hereby corrected as shown below:

In the Claims:

At column 9, line 32, in claim 9, delete the term "Or" and replace with the term --Ir--.

Signed and Sealed this
Fourth Day of February, 2014

Michelle K. Lee
*Deputy Director of the United States Patent and Trademark Office*